United States Patent
Bidaux

(10) Patent No.: US 11,092,461 B2
(45) Date of Patent: Aug. 17, 2021

(54) MAGNETIC POSITION SENSOR SYSTEM AND METHOD

(71) Applicant: Melexis Technologies SA, Bevaix (CH)

(72) Inventor: Yves Bidaux, Yverdon-les-Bains (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 81 days.

(21) Appl. No.: 16/678,336

(22) Filed: Nov. 8, 2019

(65) Prior Publication Data
US 2020/0149925 A1 May 14, 2020

(30) Foreign Application Priority Data
Nov. 12, 2018 (EP) .................... 18205705

(51) Int. Cl.
G01D 5/14 (2006.01)
G01R 33/022 (2006.01)
G01R 33/07 (2006.01)
G01R 33/09 (2006.01)

(52) U.S. Cl.
CPC .......... G01D 5/145 (2013.01); G01R 33/022 (2013.01); *G01R 33/077* (2013.01); *G01R 33/09* (2013.01)

(58) Field of Classification Search
CPC .... G01D 5/145; G01R 33/022; G01R 33/077; G01R 33/09
See application file for complete search history.

(56) References Cited

U.S. PATENT DOCUMENTS

2011/0291645 A1 12/2011 Franke et al.
2012/0084051 A1 4/2012 Hackner et al.
2013/0099777 A1* 4/2013 Heberle .............. G01D 5/145
                                                324/207.2
2016/0069708 A1 3/2016 Ausserlechner
2019/0242724 A1* 8/2019 Schott ................. G01D 5/145

FOREIGN PATENT DOCUMENTS

WO     2018122283 A1    7/2018

OTHER PUBLICATIONS

European Search Report from EP Application No. EP18205705, dated Apr. 2, 2019.
Nara et al., "A Closed-Form Formula for Magnetic Dipole Localization by Measurement of Its Magnetic Field and Spatial Gradients," IEEE Transactions on Magnetics, vol. 42, No. 10, Oct. 2006, pp. 3291-3293.

* cited by examiner

*Primary Examiner* — Reena Aurora
(74) *Attorney, Agent, or Firm* — Workman Nydegger

(57) ABSTRACT

A position sensor system for determining a position of a sensor device relative to a magnetic structure, the system comprising: said magnetic structure comprising a plurality of poles; said sensor device comprising a plurality of magnetic sensors; the magnetic structure being movable relative to the sensor device, or vice versa; wherein: a distance between centres of adjacent poles varies along the movement direction; the sensor device is adapted: for determining a first magnetic field component parallel to, and a second magnetic field component perpendicular to a movement direction, and for calculating a coarse signal based on these components; and for determining a first and second gradient of these signals along the movement direction, and for calculating a fine signal based on these gradients; and for determining said position based on the coarse signal and the fine signal.

16 Claims, 11 Drawing Sheets

Bx, dBx/dx
Bz, dBz/dx
w.r.t. the magnet

Bu, dBu/du (in plane)
Bv, dBv/du (in plane)
w.r.t. the sensor device

Bx, dBx/dx
Bz, dBz/dx
w.r.t. the magnet

Bu, dBu/du (in plane)
Bw, dBw/du (out of plane)
w.r.t. the sensor device

Bx, dBx/dx
Bz, dBz/dx
w.r.t. the magnet

Bu, dBu/du (in plane)
Bv, dBv/du (in plane)
w.r.t. sensor device

Example with 4 Horizontal Hall and 2 Integrated Magn Concentrators

Example with 2 Horizontal Hall and 2 Vertical Hall elements

Example with 8 Horizontal Hall and 2 Integrated Magn Concentrators

Example with 4 Vertical Hall elements a) determining a first magnetic field component (e.g. Bx or Bu) oriented in a movement direction, and a second magnetic field component (e.g. Bz or Bv) oriented in a direction perpendicular to the movement direction, and calculating a coarse signal (Sc) based on these magnetic field components;

⤓ 1401 b) determining a first gradient (e.g. dBx/dx or dBu/du) of the first magnetic field component along the movement direction, and a second gradient (e.g. dBz/dx or dBv/du) of the second magnetic field component along said movement direction, and calculating a fine signal (Sf) based on these magnetic field gradients;

⤓ 1402 c) determining a position (e.g. X, α) based on both the coarse signal (Sc) and the fine signal (Sf).

⤓ 1403

1400

FIG 14

MAGNETIC POSITION SENSOR SYSTEM AND METHOD

FIELD OF THE INVENTION

The present invention relates in general to the field of magnetic position sensor systems, and more in particular to a position sensor system for determining a position over a relatively large range with relatively high accuracy. The present invention also relates to a method of determining such position.

BACKGROUND OF THE INVENTION

Magnetic sensor systems, in particular linear position sensor systems and angular position sensor systems are known in the art. They offer the advantage of being able to measure a linear or angular position without making physical contact, thus avoiding problems of mechanical wear, scratches, friction, etc.

Many variants of position sensor systems exist, solving one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc.

Often two or more of these requirements conflict with each other, hence a trade-off needs to be made. A typical example is the trade-off between a large measurement range and high accuracy.

WO2018122283(A1) discloses a displacement sensor comprising two sensor units that are slidably arranged relative to a magnetic transducer.

US2011291645 describes a measuring apparatus for the detection of relative movement.

US2016069708 describes linear position and rotary position magnetic sensors, systems and methods.

There is always room for improvements or alternatives.

SUMMARY OF THE INVENTION

It is an object of embodiments of the present invention, to provide a position sensor system and a method of determining a position of a sensor device relative to a magnetic structure.

It is also an object of embodiments of the present invention to provide a specific magnetic structure and a specific sensor device which can be used in such a position sensor system.

It is a particular object of embodiments of the present invention, to provide a position sensor system having a relatively large measurement range and a relatively high accuracy, and to a method of determining a position having the same properties.

It is an object of embodiments of the present invention, to provide a position sensor system and method that is substantially insensitive to an external disturbance field.

It is an object of embodiments of the present invention, to provide a position sensor system and method which requires only relatively simple arithmetic (such as for example addition, subtraction, multiplication, division, a look-up table, interpolation) that can be performed on a simple micro-controller, but not including a Discrete Fourier-Transform (DFT) or Fast Fourier Transform (FFT) which typically requires a Digital Signal Processor (DSP), and typically also requires considerably more RAM.

It is an object of embodiments of the present invention, to provide a position sensor system and method using one or more permanent magnets, which is substantially robust against demagnetization.

These objectives are accomplished by a position sensor system and by a method for determining a position according to embodiments of the present invention, e.g. a linear or angular position.

In a first aspect, the present invention provides a position sensor system for determining a position of a sensor device relative to a magnetic structure, the system comprising: said magnetic structure comprising a plurality of poles; said sensor device comprising a plurality of magnetic sensors; the magnetic structure being movable relative to the sensor device in a movement direction or along a movement trajectory, or vice versa; wherein a distance between centres of adjacent poles of the magnetic structure varies along the movement direction or along the movement trajectory; the sensor device is adapted: a) for determining one or more first magnetic field components oriented in first direction substantially parallel to said movement direction or tangential to said movement trajectory, and one or more second magnetic field components oriented in a second direction substantially perpendicular to the first direction, and for calculating a coarse signal based on these magnetic field components; and b) for determining a first gradient of the one or more first magnetic field component along the first direction, and a second gradient of the one or more second magnetic field component along the first direction, and for calculating a fine signal based on these gradients; and c) for determining said position based on both the coarse signal and the fine signal.

The sensor device may comprise a semiconductor substrate, and the sensors may be embedded in said semiconductor substrate. The substrate may have a rectangular shape.

The coarse signal is indicative of the relative position in a first range (e.g. in an overall range). The fine signal is indicative of the relative position in a second range which is a subset of the first range.

It is an advantage of this position sensor system that it uses a combination of a coarse signal and a fine signal, because in this way the fine granularity (high accuracy) can be combined with a large range.

It is an advantage of this position sensor system that the position can be determined using a relatively simple controller and does not require a powerful processor, such as a Digital Signal Processor (DSP), because the mathematics required for determining the position can for example be based on basic operations like additions, subtractions, multiplications, divisions, a goniometric function and/or a look-up table, but does not require for example a Discrete Fourier Transform (DFT). It is noted that also the goniometric function itself can be performed using a look-up table, and optional interpolation.

It is an advantage of this position sensor system that the fine signal is based on gradient signals, which are insensitive to a (substantially constant) external stray field, hence also the combined signal is (to a certain degree) insensitive to an external stray field.

It is an advantage of this position sensor system that a rough position indication can be quickly determined based on the coarse signal alone, if required or desired.

It is an advantage of this position sensor system that the fine signal and the coarse signal contain at least some redundancy, in the sense that they allow to determine an inconsistency between the two signals, or the presence of a relatively (too) large disturbance field. Depending on the application, this information can be used to detect an error condition.

It is an advantage of this position sensor system that the position of the sensor device relative to the magnetic structure can be uniquely determined without first having to move to a "known position", e.g. after power-ON.

In preferred embodiments, the sensor device is a semiconductor chip containing a semiconductor substrate comprising said plurality of magnetic sensors.

In an embodiment (see e.g. FIGS. 1(a) to 1(c)), the sensor device is oriented such that the semiconductor substrate is oriented perpendicular to the direction of the remanent magnetic field of the magnetic structure. A coordinate axis system with three orthogonal axes X,Y,Z can be defined which is fixed to the sensor device, wherein the substrate plane defines the XY-plane. The X-direction may be oriented in the movement direction, and the remanent magnetic field may be oriented parallel to the Z-axis, thus perpendicular to the semiconductor substrate.

In another embodiment (see e.g. FIGS. 2(a) and 2(b)), the sensor device is oriented such that the semiconductor substrate is oriented parallel to the direction of the remanent magnetic field of the magnetic structure. A coordinate axis system with three orthogonal axes U,V,W can be defined which is fixed to the sensor device, wherein the substrate plane defines the UV-plane. The U-direction may be oriented in the movement direction, and the remanent magnetic field may be oriented parallel to the V-axis, thus parallel to the semiconductor substrate.

In an embodiment, the magnetic structure has a substantially flat surface or a substantially planar surface (e.g. a surface without grooves) facing the sensor device.

In an embodiment, the magnetic structure has a non-planar surface (e.g. a surface with grooves) facing the sensor device.

In an embodiment, the orientation of the remanent magnetic field inside the magnetic structure is substantially parallel to the second direction.

In an embodiment, the sensor device is movably arranged relative to the magnetic structure at a substantially constant distance from the magnetic structure.

In an embodiment, the magnetic structure comprises at least four, or at least five, or at least six pole pairs.

What is meant is that the sensor device is adapted for facing at least four, or at least five, etc. poles when moving along its trajectory, but the magnet itself may have for example four axially magnetized pole pairs, only one of which poles (of each pair) can be "seen" by the sensor device.

In an embodiment, the magnetic structure is an assembly of a plurality of discrete permanent magnets.

In an embodiment, the magnetic structure comprises a monolithic magnetic material which is magnetized so as to have multiple poles oriented in opposite directions.

In an embodiment, the magnetic structure has an (overall) elongated shape having a longitudinal axis (e.g. having a linear shape).

This is referred to as "a linear position sensor system", in which case the sensor device may be adapted for moving relative to the magnetic structure along a trajectory coinciding with or substantially parallel to said longitudinal axis.

In an embodiment, the magnetic structure has a curved shape having a curved axis (e.g. circular, spiral, elliptical, parabolic, etc).

This is referred to as an "angular position sensor system", in which case the sensor device may be adapted for moving relative to the magnetic structure along a trajectory coinciding with or located at a substantially constant distance from said curved axis. The curved axis may but need not necessarily be closed. It can for example be a circle segment or an arc segment.

In an embodiment, the remanent magnetic field inside the magnetic material is oriented substantially perpendicular to the first (e.g. linear or curved) axis (X,U).

In other words, in this embodiment, the remanent magnetic field is (locally) oriented perpendicular to the direction of (local) relative movement.

In an embodiment, said distance between centres of adjacent poles varies strict monotonically along said longitudinal or linear or curved axis.

In other words, when moving from a start position of the magnetic structure to an end position, the distance between centres of the poles increases or decreases for each new pole encountered.

It is an advantage of this embodiment that the position of the sensor device relative to the magnetic structure is uniquely defined by the two signals.

In an embodiment, the sensor device comprises a first integrated magnetic concentrator and a first and a second horizontal Hall element arranged on opposite sides of the first magnetic concentrator; and a second integrated magnetic concentrator located at a predefined distance from the first magnetic concentrator, and a third and a fourth horizontal Hall element arranged on opposite sides of the second magnetic concentrator; the first, second, third and fourth horizontal Hall element being collinear.

Such a sensor device can measure Bx1, Bz1 at the first sensor location, and Bx2, Bz2 at the second sensor location, from which dBx/dx and dBz/dx can be derived, for example as shown in FIGS. 1(a) to 1(c).

In an embodiment, the sensor device comprises a first integrated magnetic concentrator and a first group of four horizontal Hall element arranged near an edge of the first integrated magnetic concentrator, 90° angularly spaced apart; and a second group of four horizontal Hall elements arranged near an edge of the second integrated magnetic concentrator, 90° angularly spaced apart; the second IMC located at a predefined distance ΔX from the first magnetic concentrator.

Such a sensor device can measure Bx1, By1 at the first sensor location, and Bx2, By2 at the second sensor location, from which dBx/dx and dBy/dx can be derived, for example as shown in FIGS. 2(a) and 2(b).

In an embodiment, the sensor device comprises two horizontal Hall elements spaced over a first distance in the first direction; and comprises two vertical Hall elements spaced over a second distance in the first direction.

The first distance may be equal to the second distance, but that is not absolutely required. The horizontal Hall elements are adapted to measure a magnetic field vector Bz oriented in a direction perpendicular to the sensor plane, at two different locations. The two vertical Hall elements are adapted to measure a magnetic field vector Bx oriented in a direction parallel to the sensor plane, at two different locations. By determining Bx and Bz at two different locations, the gradient dBx/dx and dBz/dx can be calculated.

In an embodiment, the sensor device is adapted for calculating the coarse signal "Sc" in accordance with the following formulas or an equivalent formula:

$$Sc=\sqrt{[sqr(Bx)+sqr(Bz)]}/\sqrt{[sqr(dBx/dx)+sqr(dBz/dx)]},$$

wherein Sc is the coarse signal, √ is the square root function, sqr is the square function, Bx is the first magnetic field component, and Bz is the second magnetic field component.

It is an advantage of this formulas, that this signal substantially gradually increases from one end of the measurement range to the other, in a manner which is substantially insensitive to demagnetization effects.

In an embodiment, the sensor device is adapted for calculating the fine signal "Sf" in accordance with the following formula or an equivalent formula: Sf=Arctan 2(dBx/dx,dBz/dx), wherein Sf is the fine signal, Arctan 2 is the inverse arctangent function, dBx/dx is the gradient of the first magnetic field component along the first direction, dBz/dx is the gradient of the second magnetic field component along the first direction.

It is an advantage of this formula, that this signal is substantially insensitive to demagnetization effects.

It is an advantage that the fine signal is robust against a (constant) external disturbance field, because it is based on magnetic field gradients.

In an embodiment, the sensor device is adapted for determining said position by determining a plurality of at least two candidate positions based on the fine signal, and then selecting one of these candidate positions based on the coarse signal.

The second step (selecting) may include selecting the candidate position for which the coarse signal deviates least with a predefined coarse position associated with said fine signal (e.g. choosing point C rather than point D in FIG. 3d).

In a second aspect, the present invention also provides a method of determining a position of a sensor device relative to a magnetic structure having a plurality of poles, said sensor device comprising a plurality of magnetic sensors, the magnetic structure being movable relative to the sensor device in a movement direction or along a movement trajectory, or vice versa; wherein a distance between centres of adjacent poles of the magnetic structure varies along the movement direction or along the movement trajectory; and the method comprises the steps of: a) determining one or more first magnetic field components oriented in a first direction parallel to said movement direction or tangential to said movement trajectory, and one or more second magnetic field components oriented in a second direction perpendicular to the first direction, and calculating a coarse signal "Sc" based on these magnetic field components; and b) determining a first gradient of the one or more first magnetic field component along the first direction and a second gradient of the one or more second magnetic field component along the first direction, and calculating a fine signal "Sf" based on these gradients; c) determining said position based on both the coarse signal "Sc" and the fine signal "Sf".

In an embodiment, determining the one or more first magnetic field components comprises determining one or more magnetic field components parallel to the semiconductor substrate of the sensor device (also referred to herein as "in-plane magnetic field component"), and determining the one or more second magnetic field components comprises determining one or more magnetic field components perpendicular to the semiconductor substrate of the sensor device (also referred to herein as "out-of-plane magnetic field component").

In an embodiment, determining the one or more first magnetic field components and determining the one or more second magnetic field components comprises determining one or more magnetic field components parallel to the semiconductor substrate of the sensor device (both referred to herein as "in-plane magnetic field component").

In an embodiment, step a) comprises: calculating the coarse signal "Sc" in accordance with one of the following formulas or equivalent formulas:

$$Sc=\sqrt{[sqr(Bx)+sqr(Bz)]}/\sqrt{[sqr(dBx/dx)+sqr(dBz/dx)]}, \text{ or}$$

$$Sc=[sqr(Bx)+sqr(Bz)]/[sqr(dBx/dx)+sqr(dBz/dx)],$$

wherein Sc is the coarse signal, √ is the square root function, sqr is the square function, Bx is the first magnetic field component, and Bz is the second magnetic field component.

In an embodiment, step b) comprises: calculating the fine signal "Sf" in accordance with the following formula or an equivalent formula: Sf=Arctan 2(dBx/dx, dBz/dx), wherein Sf is the fine signal, Arctan 2 is the inverse arctangent function, dBx/dx is the gradient of the first magnetic field component along the first direction, dBz/dx is the gradient of the second magnetic field component along the first direction.

In an embodiment, step c) comprises: determining said position by determining a plurality of at least two candidate positions based on the fine signal "Sf", and then selecting one of these candidate positions based on the measured coarse signal "Sc".

Step c) may comprise: choosing the candidate that shows the smallest deviation from a predetermined coarse signal corresponding to this fine signal, e.g. as determined during a calibration step. The sensor device may comprise for example a look-up table with at least three columns, a first column storing values for the fine signal, the second column storing values for the coarse signal, the third column storing values of an actual displacement value along the direction of movement, or along the movement trajectory, and the method may include the step of finding the best matching value, e.g. using interpolation (e.g. linear interpolation).

In a third aspect, the present invention also provides a position sensor device for use in a position sensing system according to the first aspect, the position sensor device comprising: a semiconductor substrate; for determining a first magnetic field component oriented in a first direction substantially parallel to the substrate on at least two different locations spaced apart over a first predefined distance along a first direction, and for determining a second magnetic field component oriented in a second direction substantially perpendicular to the first direction, substantially parallel to the semiconductor substrate or substantially perpendicular to the semiconductor substrate, on at least two different locations spaced apart over a second predefined distance along said first direction; a processing unit adapted for calculating a coarse signal based on at least some of these magnetic field components; the processing unit being further adapted for determining a gradient of the first magnetic field component along the first direction and a gradient of the second magnetic field component along the first direction, and for calculating a fine signal based on these gradients; the processing unit being further adapted for determining said position based on both the coarse signal and on the fine signal.

The second predefined distance may be the same as the first predefined distance, or different from the first predefined distance.

The semiconductor substrate may be a silicon substrate or a CMOS substrate.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 3(a) shows the sensor system in top view, FIG. 3(b) and FIG. 3(c) show the sensor system in side view, when looking in the Y-direction or from the X-direction respectively.

FIG. 14 illustrates a method of determining a position of a sensor device relative to a magnetic structure, according to an embodiment of the present invention.

Figure 1A:
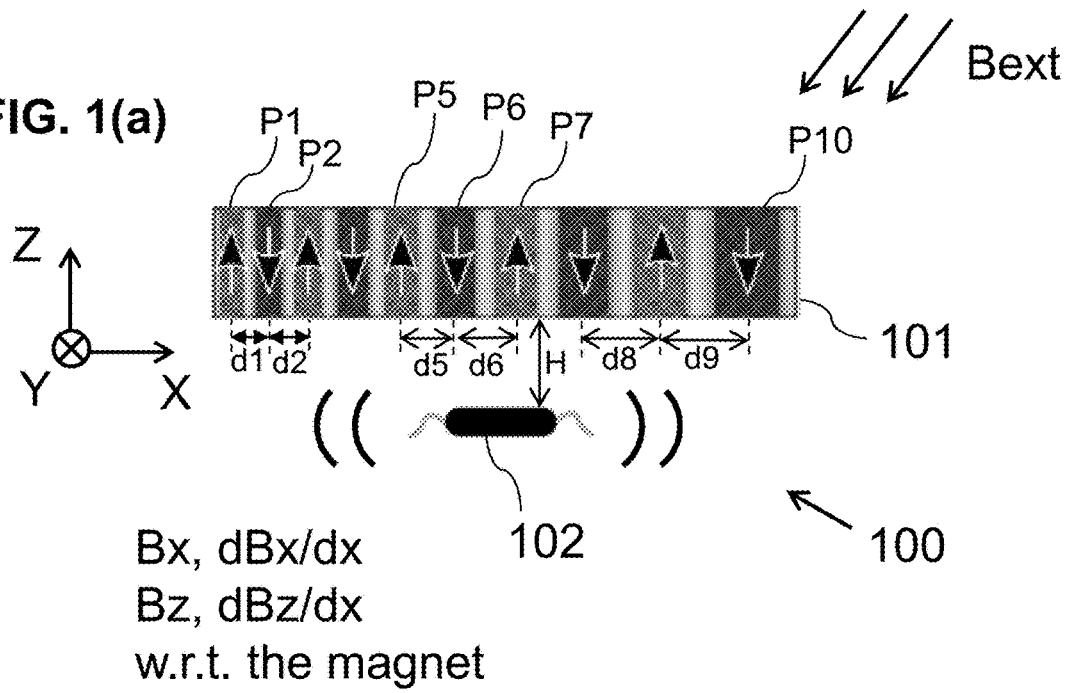
FIGS. 1(a) to 1(c) illustrate an exemplary linear position sensor system according to an embodiment of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, unless explicitly mentioned otherwise, the term "magnetic sensor device" or "sensor device" refers to a device comprising at least one magnetic "sensor element". The sensor device may be comprised in a package, also called "chip", although that is not absolutely required.

In this document, the term "sensor element" or "magnetic sensor element" or "sensor" can refer to a component or a group of components or a sub-circuit or a structure capable of measuring a magnetic quantity, such as for example a magneto-resistive element, an XMR element, a horizontal Hall plate, a vertical Hall plate, a Wheatstone-bridge containing at least one (but preferably four) magneto-resistive elements, etc.

In this document, the expression "in-plane components of a vector" and "projection of the field component in the sensor plane" mean the same. Examples are the Bx component in FIGS. 1(a) to 1(c), or the Bu component in FIG. 2(a) to FIG. 4(d).

In this document, the term "sensor plane" refers to the plane defined by the semiconductor substrate containing the sensor elements.

In this document, the expression "out-of-plane components of a vector" and "projection of the field component on an axis perpendicular to the sensor plane" mean the same. An example is the Bz component in FIGS. 1(a) to 1(c).

In this document, the expression "spatial derivative" or "derivative" or "spatial gradient" or "gradient" are used as synonyms, unless clear from the context that something else was meant. In this document, the gradient of a component is taken along the direction of movement, for example d/dx in FIGS. 1(a) to 1(c), d/du which is equal to d/dx in FIGS. 2(a) and 2(b), d/du in a direction tangential to a circular path in FIGS. 3(a) and 3(d) and FIGS. 4(a) to 4(d).

In the context of the present invention, the formulas arctan(x/y), a tan 2(x,y), arccot(y/x) are considered to be equivalent.

It is an object of the present invention, to provide a position sensor system and a method of determining a position of a sensor device relative to a magnetic structure.

The present invention provides: a position sensor system for determining a position of a sensor device relative to a magnetic structure, the position sensor system comprising: a magnetic structure comprising a plurality of poles; a sensor device comprising a plurality of magnetic sensors; the magnetic structure being movable relative to the sensor device in a movement direction or along a movement trajectory, or the sensor device being movable relative to the magnetic structure in a movement direction or along a movement trajectory; wherein a distance between centres of adjacent poles of the magnetic structure varies along the movement direction or the movement trajectory; and wherein the sensor device is adapted (a) for determining one or more first (e.g. in-plane) magnetic field components oriented in a first direction parallel to said movement direction or tangential to said movement trajectory, and one or more second (e.g. in-plane or out-of-plane) magnetic field components oriented in a second direction perpendicular to the first direction, and for calculating a coarse signal "Sc" based on these magnetic field components; and (b) for determining a first gradient of the one or more first magnetic field component along the first direction and a second gradient of the one or more second magnetic field component along the first direction, and for calculating a fine signal "Sf" based on these gradients; and (c) for determining the (e.g. linear or angular) position of the sensor device relative to the magnetic structure based on both the coarse signal "Sc" and the fine signal "Sf".

The sensor system of the present invention makes use of a specific magnetic structure, where a distance between the poles is not constant, but varies. This magnetic structure generates a specific magnetic field, having specific properties. As far as is known to the inventors, such a magnetic structure and its properties are not known in the art.

Figure 1B:
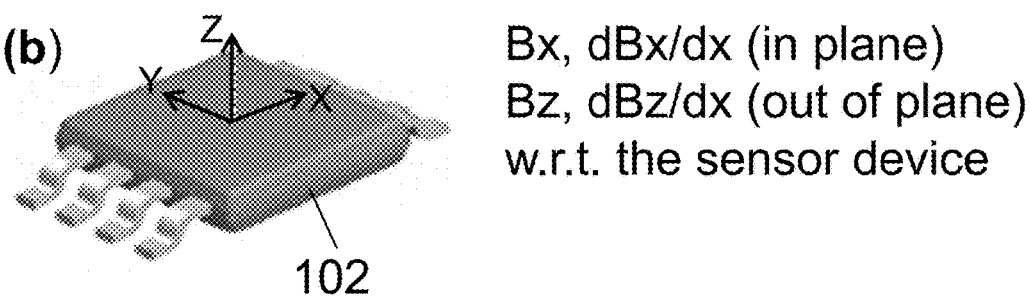
Figure 1C:
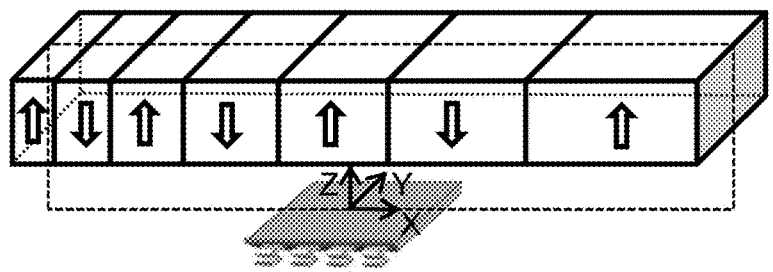

The present invention is at least partly based on the following insights (see e.g. the waveforms of FIGS. 5(a) to 5(d) applicable to the system of FIGS. 1(a) to 1(c)):

(1) that the first magnetic field component (e.g. Bx) and the second magnetic field component (e.g. Bz), measured at a predefined distance from the magnet structure, are or may be substantially shifted over 90°, and (2) that the magnitude |Bxz| of these magnetic field components (Bx, Bz) increases as the distance between adjacent pole pairs increases (thus the sum of the squares of the two field components measured at a predefined distance from the magnet is not constant), and (3) that the spatial derivatives of these magnetic field components along the direction of movement turn out to be substantially constant, despite that the magnitude of the field components themselves increase (e.g. substantially linearly), because the distance between centres of the poles also increases and hence the spatial derivative remains largely constant, and (4) that the ratio of the sum of squares of the first and the second field component (in FIGS. 1(a) to 1(c): Bx and Bz) (as nominator) and the sum of squares of the spatial derivatives (as denominator) is substantially independent of the actual magnetic field strength, thus the coarse signal "Sc" is substantially insensitive to demagnetization effects, and (5) that the ratio of the first gradient and the second gradient is substantially independent of the actual magnetic field strength, thus the fine signal is substantially insensitive to demagnetization effects, and (6) the fine signal is substantially independent of an external disturbance field, (in particular a constant disturbance field), because the fine signal is based on gradients.

The combination of these features provide unique properties to the position sensor system of being highly accurate (fine positioning), having a large measurement range (despite the high accuracy), being robust against an external disturbance field, and being robust against demagnetization.

In existing solutions, often a trade-off needs to be made between accuracy and range (for example as described in WO2014029885A1, where the maximum range of some embodiments is reduced to 360°/N).

FIG. 1(a) is a schematic block-diagram of an exemplary linear position sensor system 100 according to an embodiment of the present invention.

It is a linear position sensor system, comprising a sensor device 102 in the form of an integrated chip, which is movable relative to a magnetic structure 101, meaning that the magnetic structure 101 may be fixed while the sensor device 102 is movable, or that the sensor device 102 is fixed while the magnetic structure 101 is movable, or both the sensor device 102 and the magnetic structure 101 are movable.

The invention will be further described assuming that the magnetic structure 101 is fixed, and the sensor device 102 is movable to simplify the discussion, but the present invention is not limited thereto.

The sensor device 102 of FIGS. 1(a) to 1(c) is arranged at a substantially constant distance H from the magnetic structure 101, for example in the order of about 0.5 to about 5.0 mm, and can be moved in the X-direction, substantially parallel to a surface of the magnetic structure, hence maintaining a constant distance "H" from the magnetic structure.

The magnetic structure 101 comprises magnetic material which is magnetised in a particular manner. FIG. 1(a) shows a vertical cross-section of the magnetic structure, and the arrows show that the remanent magnetic field inside the magnetic material is oriented either in the positive Z-direction, or the negative Z-direction, hence perpendicular to the direction of movement X.

One of the underlying ideas of the present invention is that the magnetic structure 101 has a plurality of magnetic poles P1, P2, P3, . . . which are not located equidistantly, but the distances between centers of adjacent poles vary. Preferably the distances vary strict monotonically, implying inter alia that all distances are different.

In the example of FIG. 1(a), the magnetic structure 101 has 10 magnetic poles P1 . . . P10, and in the example of FIG. 1(c) the magnetic structure 101 has seven magnetic poles, but of course the present invention is not limited thereto, and a magnetic structure with a larger or smaller number of poles can also be used, for example any number in the range from 3 to 50, or from 4 to 50, or from 5 to 50, or any number in the range from 3 to 30, or any number in the range from 4 to 20.

In the example of FIG. 1(a), the distance d1 between the first pole P1 and the second pole P2 is smaller than the distance d2 between the second pole P2 and the third pole P3, etc. In the example of FIG. 1(a), the distance monotonically increases from the left of FIG. 1(a) to the right of FIG. 1(a), meaning that d1<d2<d3< . . . <d9. The inventors found that based on the signals which can be measured by the sensor device 102, the position of the sensor device 102 on the X-axis can be uniquely determined, and with high accuracy (e.g. with a higher accuracy than would be possible if the magnetic structure 101 would contain only two or only three or only four equidistant poles), as will be explained further, when discussing FIGS. 5(a) to 5(d).

Without limiting the invention thereto, in preferred embodiments the distance d[i+1] may be chosen to be substantially equal to the distance d[i] multiplied by a factor F chosen in the range from about 103% to 200%, depending on the application. The factor F may be constant over the entire length of the magnetic structure 101, but that is not absolutely required. In other embodiments, the factor F may vary for each pair, or for some of the pairs.

In the specific example shown in FIGS. 1(a) to 1(c), the factor F is constant and about equal to 111%, but other values could also be used, for example approximately 103% or approximately 104% or approximately 105% or approximately 106% or approximately 107% or approximately 108% or approximately 109% or approximately 110% or approximately 111% or approximately 112% or approximately 114% or approximately 116% or approximately 118% or approximately 120% or approximately 125% or approximately 130% or approximately 135% or approximately 140% or approximately 145% or approximately 150% or approximately 160% or approximately 170% or approximately 180% or approximately 190% or approximately 200%. The impact hereof will become clear when discussing FIGS. 5(a) to 5(d).

While the distance d9 of the magnetic structure shown in FIG. 1(a) is about 2.3 times larger than the distance d1, this is only an example, and another ratio dmax/dmin between the maximum distance "dmax" and minimum distance "dmin" can also be chosen, for example but without limiting the present invention thereto, any ratio in the range from about 110% to about 800%, or a ratio in the range from about 150% to about 400%. The impact hereof will become clear when discussing FIGS. 5(a) to 5(d).

In the embodiments of FIG. 1(a) to FIG. 1(c), the sensor device 102 is oriented such that its semiconductor substrate is substantially perpendicular to the orientation of the remanent magnetic field inside the magnetic structure.

In FIGS. 1(a) to 1(c), coordinate axes X, Y, Z can be considered fixedly attached to the magnetic structure. The magnetic sensor is preferably configured to measure one or more magnetic field components Bx in the X-direction, oriented parallel to the semiconductor substrate, which can therefore be referred to as "in-plane" magnetic field component(s) for the sensor device of FIGS. 1(a) to 1(c), and for measuring one or more magnetic field components Bz in the Z-direction, perpendicular to the semiconductor substrate, which can therefore be referred to as "out-of-plane" magnetic field component(s) for the sensor device. In case of FIGS. 1(a) to 1(c), one could therefore also consider that the X, Y, Z axes are fixed to the sensor device.

FIG. 1(c) shows a perspective view for a magnetic structure having seven magnet poles, to better illustrate the preferred relative position of the magnetic structure 101 and the sensor device 102.

Figure 2A:
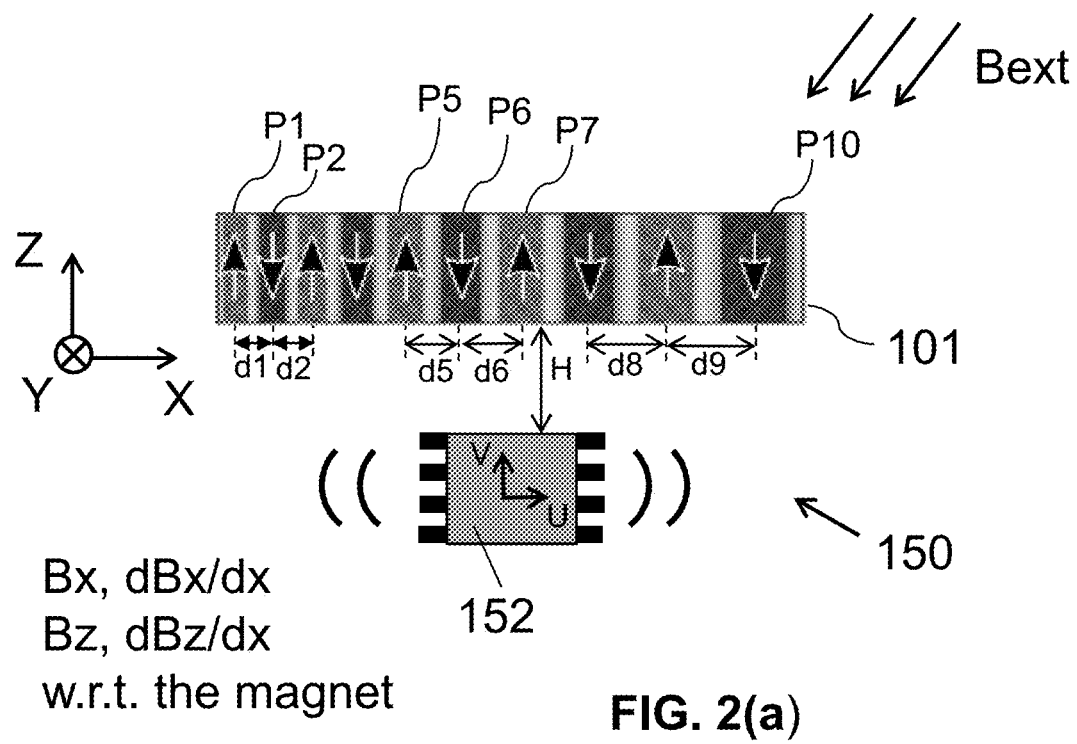
FIGS. 2(a) and 2(b) illustrate another exemplary linear position sensor system according to an embodiment of the present invention, which can be seen as a variant of FIGS. 1(a) to 1(c).
Figure 2B:
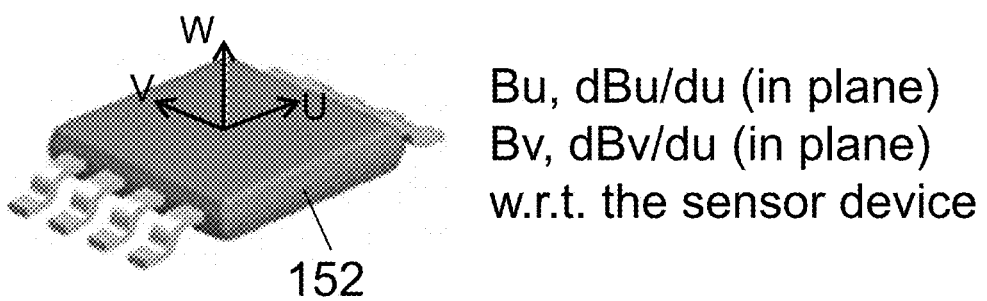

FIGS. 2(a) and 2(b) show a variant of FIGS. 1(a) to 1(c), where the sensor device 152 is oriented such that its semiconductor substrate is substantially parallel to the remanent magnetic field inside the magnetic structure. Assuming that orthogonal axes X, Y, Z are fixed to the magnetic structure, and assuming that orthogonal axes U, V, W are fixed to the sensor device, the skilled reader will understand that, if the U-axis is parallel to the X-axis, and the V-axis is parallel to the Z-axis, and the W-axis is parallel to the Y-axis, the magnetic field components Bu and By correspond to the magnetic field components Bx and Bz, respectively, relative to the magnetic structure. As will be explained further (see FIGS. 7(a) and 7(b)), the sensor device 152 is configured for measuring in-plane field components Bu1, Bv1, Bu2, Bv2, oriented parallel to the semiconductor substrate, and for calculating a first gradient dBu/du and a second gradient dBv/du.

In another variant of FIGS. 1(a) to 1(c) (not shown), the magnetic material is magnetised substantially in the movement direction (e.g. in the direction of the longitudinal axis), e.g. the positive X-axis or the negative X-axis.

Figure 3A:
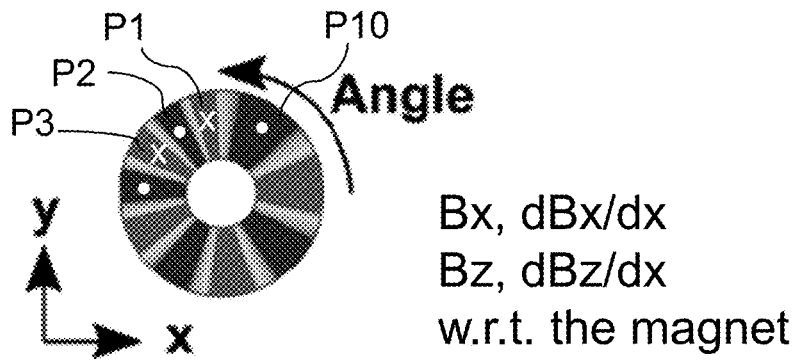
FIGS. 3(a) to 3(d) are a schematic block-diagram of an exemplary angular position sensor system according to an embodiment of the present invention.
Figure 3B:
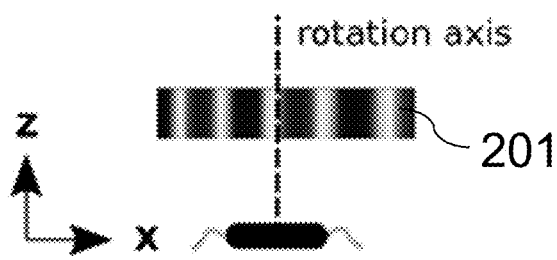
Figure 3C:
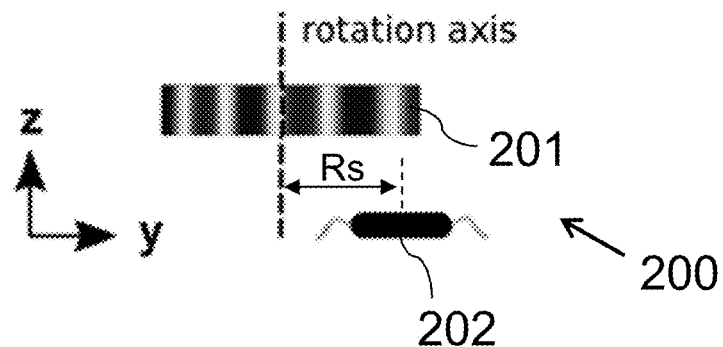
Figure 3D:
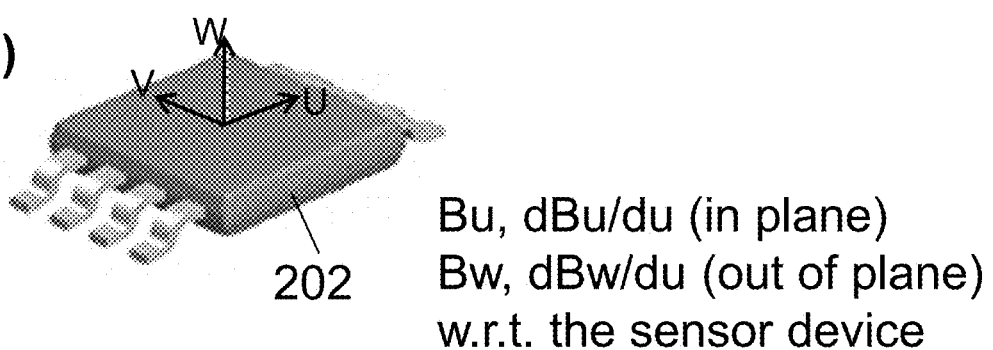
Figure 4A:
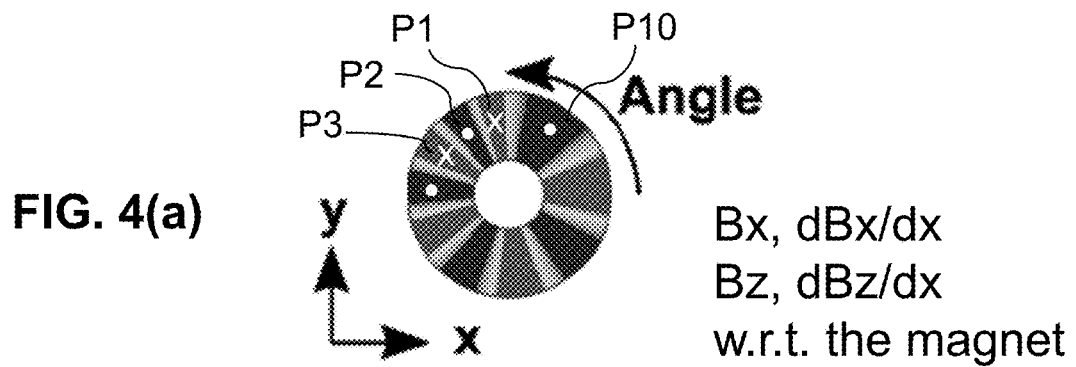
FIGS. 4(a) to 4(d) illustrate another exemplary angular position sensor system according to an embodiment of the present invention, which can be seen as a variant of FIGS. 3(a) and 3(d).
Figure 4B:
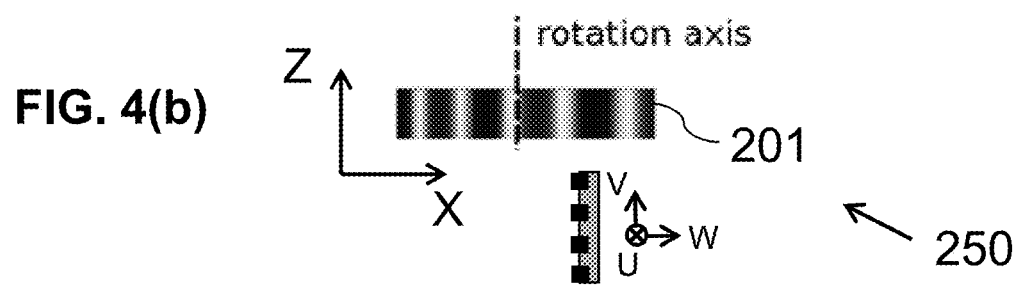
Figure 4C:
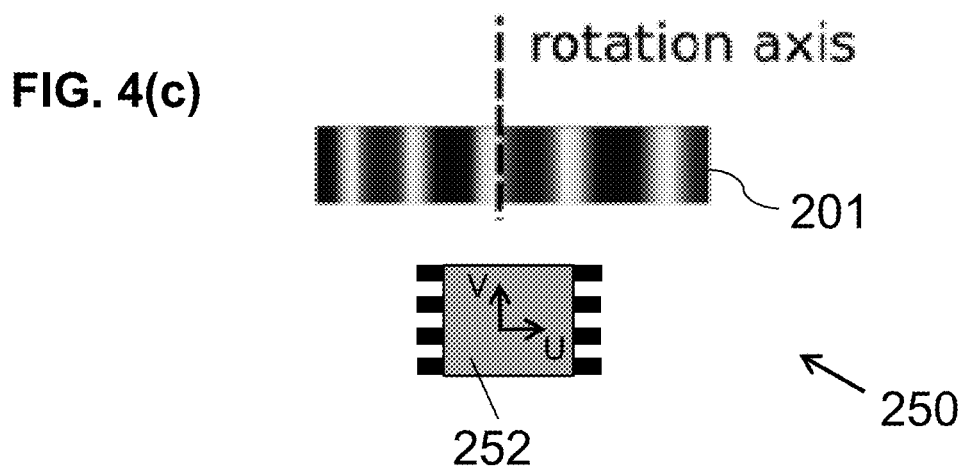
Figure 4D:
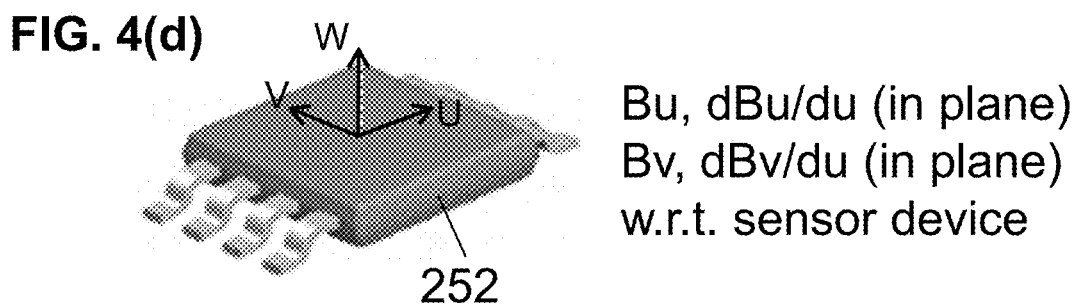

FIGS. 3(a) and 3(d) are a schematic block-diagram of an exemplary angular position sensor system 200 according to an embodiment of the present invention.

The same principles as described above are also applicable here, mutatis mutandis, meaning inter alia that "linear distance" needs to be converted into "angular distance", and "shift over the linear X-axis" needs to be converted into "rotation about the Z axis", etc.

One of the underlying ideas of the present invention applied to this embodiment is that the magnetic structure 201 has a plurality of magnetic poles, in the example of FIGS. 3(a) and 3(d) ten poles, P1, P2, . . . P10, which poles P1, P2, . . . are not located equidistantly, but the angular distances α1, α2, . . . between centres of adjacent poles vary, such that α1<α2< . . . <α9 (see also FIG. 11). The structure may be axially magnetized, or the magnetization may be in-plane (e.g. oriented radially, or oriented tangentially), or the structure may be isotropically magnetized in the Z-direction.

The inventors found that based on the magnetic signals which can be measured by the sensor device 202, the angular position α of the sensor device 202 with respect to a reference position of the magnetic structure 201 can be uniquely determined, and with high accuracy (e.g. larger than would be possible if the magnetic structure would contain only three or only four poles).

The same or similar remarks with respect to the multiplication factor F (e.g. being a value in the range from about 103% to about 200%) and to the ratio dmax/dmin (representing an angular distance in this example) are also applicable here.

In the example of FIGS. 3(a) and 3(d), the sensor device 202 is located at an "off-axis position" (i.e. not located on the rotation axis, but at a non-zero distance Rs therefrom, larger than 1 mm, e.g. at least 2 mm or at least 3 mm) and is oriented such that its semiconductor substrate is substantially perpendicular to the rotation axis of the magnetic structure.

A first coordinate system with three orthogonal axes X, Y, Z is fixed to the magnetic structure, and a second coordinate system with three orthogonal axes U, V, W is fixed to the sensor device.

The sensor device 202 is preferably oriented such that the U-axis is tangential to an imaginary circle around the rotation axis, and such that the W-axis of the sensor device is parallel to the Z-axis of the magnetic structure. The magnetic signals Bu and Bw of FIGS. 3(a) and 3(d) are comparable to the signals Bx and Bz of FIG. 1(a), and likewise, the gradient signals dBu/du and dBw/du are comparable to the signals dBx/dx and dBz/dx of FIG. 1(a). The same sensor elements can be used in the sensor device 202 of FIGS. 3(a) and 3(d) and the sensor device 102 of FIGS. 1(a) to 1(c), examples of which are illustrated for example in FIG. 6(a) and FIG. 6(b), but the present invention is not limited hereto, and other sensor elements may also be used.

Figure 7A:
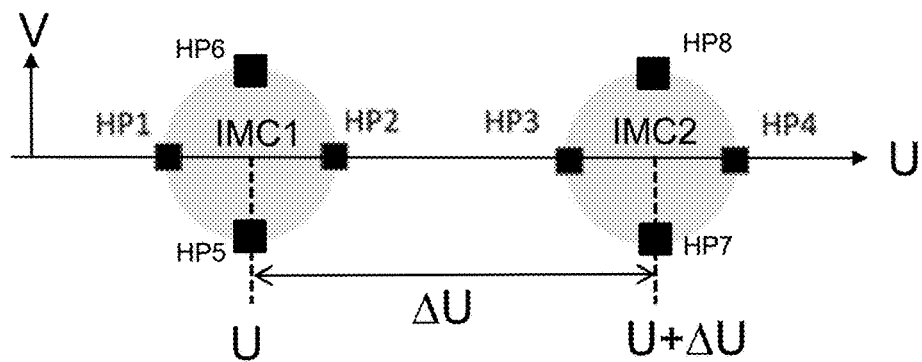
FIG. 7(a) is a schematic block-diagram showing an exemplary arrangement of sensor elements as can be used in a sensor device according to an embodiment of the present invention, which sensor device can be used in the linear position sensor system of FIGS. 2(a) and 2(b) and/or in the angular position sensor system of FIGS. 4(a) to 4(d). This sensor arrangement contains two IMC elements and eight horizontal Hall elements.
Figure 7B:
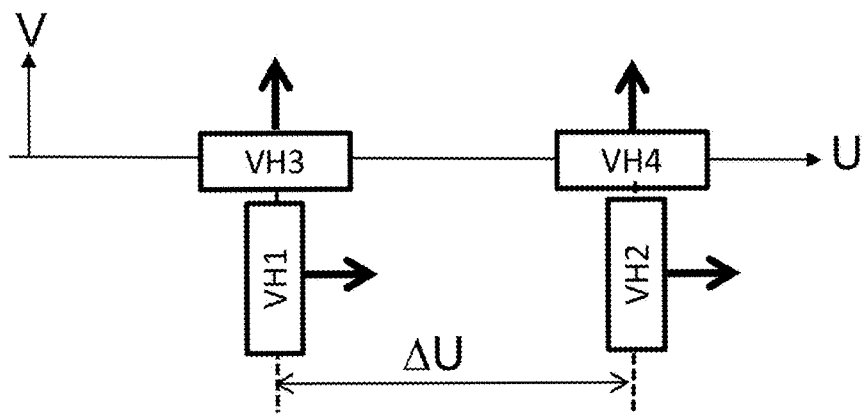
FIG. 7(b) is a schematic block-diagram showing another exemplary arrangement of sensor elements as can be used in the sensor device of the linear position sensor system of FIGS. 2(a) and 2(b) and/or in the angular position sensor system of FIGS. 4(a) to 4(d). This sensor arrangement contains four vertical Hall elements.

FIGS. 4(a) to 4(d) show a variant of FIGS. 3(a) and 3(d), where the sensor device 252 is oriented such that its semiconductor substrate is substantially parallel to the remanent magnetic field inside the magnetic structure. Assuming that orthogonal axes X, Y, Z are fixed to the magnetic structure, and assuming that orthogonal axes U, V, W are fixed to the sensor device, the sensor device 252 is preferably oriented such that the U-axis is tangential to an imaginary circle around the rotation axis, and such that the V-axis of the sensor device is parallel to the Z-axis of the magnetic structure. The magnetic signals Bu and By of FIGS. 4(a) to 4(d) are comparable to the signals Bu and By of FIGS. 2(a) and 2(b), and thus the gradient signals derived therefrom are also comparable. The same sensor elements can be used in the sensor device 252 of FIGS. 4(a) to 4(d) and the sensor device 152 of FIGS. 2(a) and 2(b), an examples of which is illustrated in FIGS. 7(a) and 7(b), but the present invention is not limited hereto, and other sensor elements may also be used, for example four vertical Hall elements, or a plurality of magneto-resistive elements.

FIG. 5(a) to FIG. 5(d) shows signals related to the exemplary linear position system of FIGS. 1(a) to 1(c), illustrating some of the principles of the present invention.

Figure 5A:
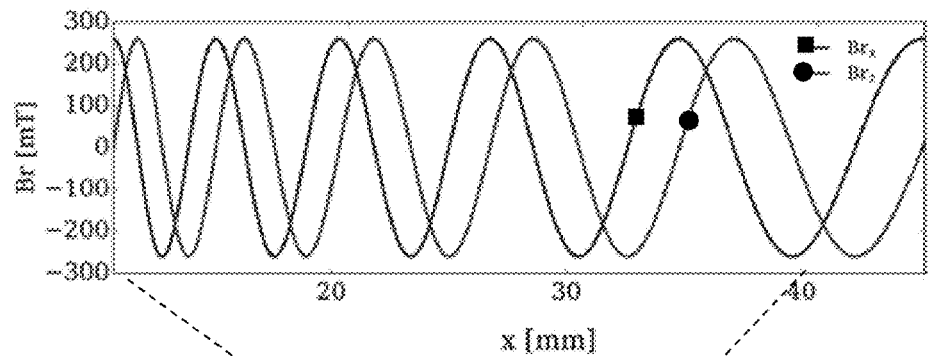
FIG. 5(a) to FIG. 5(d) show signals related to the exemplary linear position system of FIGS. 1(a) to 1(c), illustrating some of the principles of the present invention.

FIG. 5(a) shows the remanent magnetic field Brx, Brz inside the magnetic material. It is noted that the remanent magnetization can be along Brz and Brx, or along Brz only, or along Brx only.

Figure 5B:
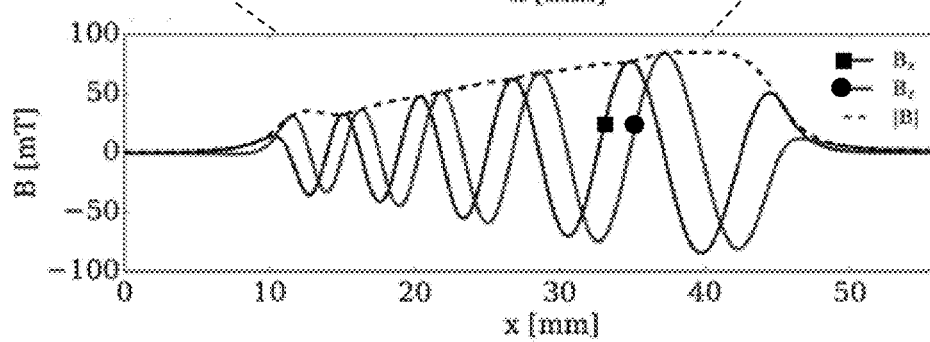

FIG. 5(b) shows the magnetic field components Bx (indicated by a black square), Bz (indicated by a black circle) at a predefined distance "H" outside of the magnetic material, as can be measured by the sensor device 102. The drawing also shows (in dotted line) the value |B| which is calculated here as:

$$|B|=\text{sqrt}(Bx*Bx+Bz*Bz) \quad [1]$$

As can be seen, the value |B| is a relatively smooth signal which (at least over a portion of the measurement range) monotonically increases with X (although that is not absolutely required for the present invention to work). It was found that if the centres of the poles are located further apart, the magnetic field strength measured by the sensor device (at a relatively small constant distance H) increases.

Figure 5C:
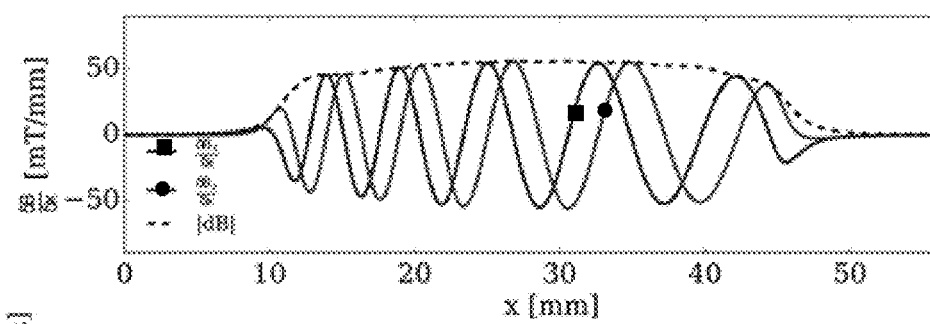

The inventors came to the idea of determining the spatial gradients of these signals in the X-direction. FIG. 5(c) shows the spatial derivative dBx/dx of the in-plane field component Bx (indicated by a black square) and shows the spatial derivative dBz/dx of the out-of-plane magnetic field component Bz (indicated by a black circle). FIG. 5(c) also shows (in dotted line) the value |dB| which is calculated here as:

$$|dB|=\text{sqrt}(dBx/dx*dBx/x+dBz/dx*dBz/dx) \quad [2]$$

As can be seen, the value |dB| is also a relatively smooth signal which (at least over a portion of the measurement range) is substantially constant (although that is not absolutely required for the present invention to work).

The inventors also came to the idea of calculating a first signal "Sc" based on, e.g. as a function of the in-plane magnetic field component Bx and the out-of-plane magnetic field component Bz, more particularly, as the ratio of the signal |B| and the signal |dB|, thus:

$$Sc=|B|/|dB| \quad [3]$$

which according to [1] and [2] can be written as:

$$Sc = \sqrt{Bx \cdot Bx + Bz \cdot Bz} / \sqrt{dBx/dx \cdot dBx/x + dBz/dx \cdot dBz/dx} \quad [4]$$

Figure 5D:
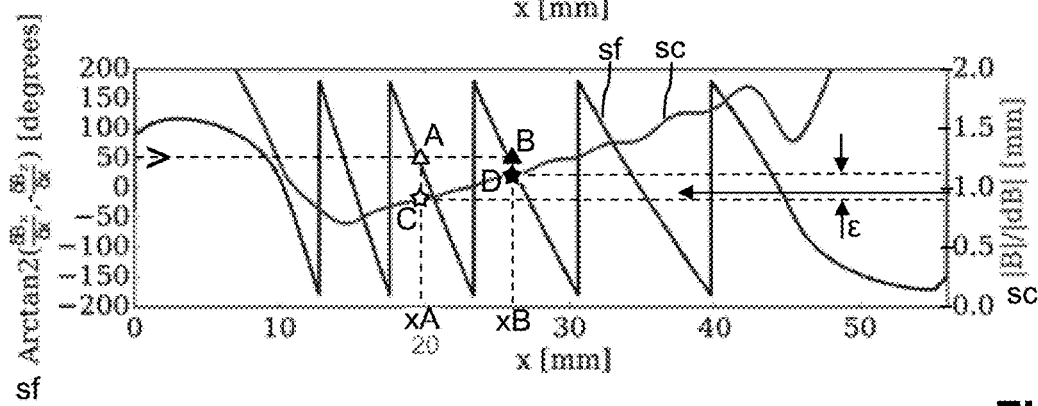

As can be appreciated from FIG. 5(d), this signal can be used as a rough or coarse indicator for the position X of the sensor device 102 relative to the magnetic structure 101, but as can be seen, the accuracy of this signal is relatively low.

In a variant, the signal Sc is defined as:

$$Sc' = (Bx \cdot Bx + Bz \cdot Bz) / (dBx/dx \cdot dBx/dx + dBz/dx \cdot dBz/dx) \quad [5]$$

which is also substantially smooth but avoids the calculation of two square root functions. In fact, also the division by "dx" is not required, since it is constant.

The inventors also came to the idea of calculating a second signal "Sf" based on, e.g. as a function of the field gradients dBx/dx and dBz/dx, more particularly, as the function:

$$Sf = \text{Arctan } 2(dBx/dx, dBz/dx) \quad [6]$$

(the function arctan 2 is also known as the a tan 2-function. The reader not familiar with this function can find more information, for example on "https://en.wikipedia.org/wiki/Atan2") As can be appreciated from FIG. 5(d), the signal Sf looks like a "sawtooth-function", but with non-constant teeth. This signal can be used as a fine indicator (within each tooth) for the position X of the sensor device 102, but as can be seen, the range of each tooth is only a subrange of the total range.

By combining the coarse signal Sc and the fine signal Sf, a unique position X of the sensor device 102 can be defined on the X-axis, with large accuracy. Moreover, since the signal Sf is based on gradient signals, this position is highly insensitive to a (constant) external disturbance field Bext.

The following example will explain how the unique position may be determined, without limiting the present invention to this example, or even to this method, as other methods may also be used. Referring to FIG. 5(d), suppose that the value Sf yields the value 50°, and suppose that the function Sc yields the value 0.96. As indicated in FIG. 5(d), there are multiple possible positions (one on each sawtooth) having the value Sf=50°. Consider for example two candidates xA and xB associated with the point "A" (white triangle) and the point "B" (black triangle). The function Sc=0.96 can then be used to determine which of these candidates is the most likely candidate. In the example shown, the point C (white star) corresponds to a value Sc of approximately 0.93, and the point D (black star) corresponds to a value Sc of approximately 1.10. In this example, the point A is thus the most likely one, because (0.96-0.93=0.03) is smaller than (1.10-0.96=0.14).

The values of Sc for a plurality of positions may be determined during calibration and may for example be stored in a non-volatile memory, or may be stored as a piecewise linear function, or in any other suitable way.

The value Sc is slightly sensitive to an external disturbance field; hence the actual value Sc may differ from the stored (or interpolated) value Sc would have at point C or point D, because of the external disturbance field. It is noted however that the external disturbance field needs to be quite high before the algorithm described above "selects the wrong tooth". Hence, the algorithm described above is quite robust against an external disturbance field (of moderate strength). The tolerance margin can be appreciated to be equal to about half the step ε. Thus, the larger this step ε, the more tolerant the sensor system is against an external disturbance field. Having the benefit of this disclosure, the skilled person will now understand that, increasing the number of poles (for a given total range) corresponds to decreasing this tolerance against external field disturbances. However, as long as the actual external disturbance field is smaller than this tolerance margin, the sensor provides a highly accurate unique position over a relatively large range (in the example spanning multiple poles).

As can be appreciated from FIG. 5(d), the signals on the left end of the magnetic structure and on the right end of the magnetic structure cannot be used, but in practice the skilled person can make the magnetic structure slightly larger than the range to be measured.

While in the example of FIGS. 5(a) to 5(d), the magnitude |Bxz| of the magnetic field components increases as the distance between adjacent pole pairs increases (see FIG. 5b), and the in-plane derivatives of these magnetic field components is substantially constant (see FIG. 5c), this is not absolutely required, and the invention will also work if d[Bxz]/dx varies without the derivative itself being substantially constant, as long as the combination of the fine signal Sf and the coarse signal Sc, e.g. in the form of two values in the look-up table, are unique, i.e. correspond to a single position. This also means that the invention will still work, even if the coarse signal Sc (see FIG. 5d) does not monotonically increase, but has a constant portion, or even has a local dip, as long as the combination of the two signals Sf and Sc is unique.

Figure 6A:
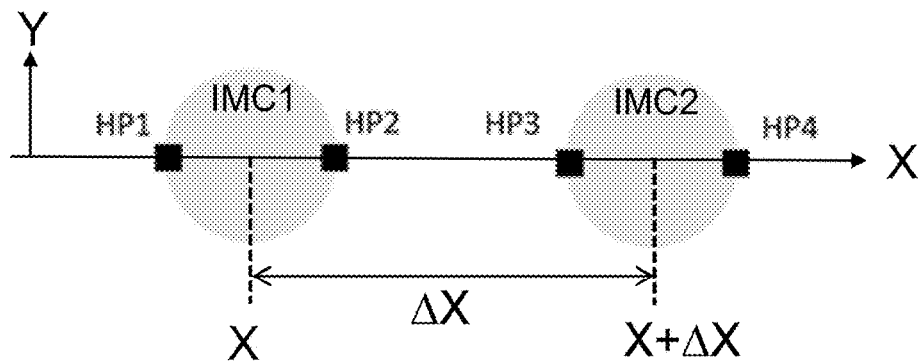
FIG. 6(a) is a schematic block-diagram showing an exemplary arrangement of sensor elements as can be used in a sensor device according to an embodiment of the present invention, which sensor device can be used in the linear position sensor system of FIGS. 1(a) to 1(c) and/or in the angular position sensor system of FIGS. 3(a) and 3(d). This sensor arrangement contains four collinear horizontal Hall elements and two IMC elements.

FIG. 6(a) is a schematic block-diagram showing an exemplary arrangement of sensor elements as can be incorporated in the linear position sensor device 102 of FIGS. 1(a) to 1(c) and/or in the angular position sensor device 202 of FIGS. 3(a) and 3(d). This sensor arrangement shown in FIG. 6(a) contains four collinear horizontal Hall elements (indicated by black squares) and two IMC elements (indicated by gray circles). As is known in the art (e.g. from WO2014029885A1), such structures can be used to determine (e.g. measure and/or calculate) an in-plane magnetic field component Bx oriented in a direction parallel to the semiconductor substrate, and an out-of-plane magnetic field component Bz oriented in a direction perpendicular to the semiconductor substrate of the sensor device.

More in particular, if the signal provided by the first, second, third and fourth Hall element is HP1, HP2, HP3 and HP4 respectively, then the value of Bx at position X can be calculated as:

$$BxL = HP1 - HP2 \quad [4.1],$$

and the value Bz at position X can be calculated as:

$$BzL = HP1 + HP2 \quad [4.2],$$

and the value of Bx at position X+ΔX can be calculated as:

$$BxR = HP3 - HP4 \quad [4.3],$$

and the value of Bz at position X+ΔX can be calculated as:

$$BzR = HP3 + HP4 \quad [4.4]$$

From these magnetic field values BxL, BzL, BxR, BzR, which are measured directly or indirectly, other values can be calculated, for example one or more of the following:

an in-plane field gradient (where the division by/ΔX is omitted, because it is constant):

$$dBx = HP1 - HP2 + HP4 - HP3 \quad [4.5]$$

an out-of-plane field gradient (where the division by/ΔX is omitted, because it is constant):

$$dBz = HP1 + HP2 - HP3 - HP4 \quad [4.6]$$

an average in-plane field value:

$$|Bx|=(BxL+BxR)/2 \qquad [4.7]$$

an average out-of-plane field value:

$$|Bz|=(BzL+BzR)/2 \qquad [4.8]$$

an average magnitude of the magnetic field:

$$|Bxz|=\text{sqrt}(\text{sqr}(Bx)+\text{sqr}(Bz)) \qquad [4.9]$$

$$|dBxz|=\text{sqrt}(\text{sqr}(dBx/dx)+\text{sqr}(dBz/dx)) \qquad [4.10]$$

a course signal:

$$Sc=|Bxz|/|dBxz| \qquad [4.11]$$

a fine signal:

$$Sf=\text{Arctan }2(dBx/dx,dBz/dx) \qquad [4.12]$$

The combination of Sc and Sf then yield a single value for X or α, as explained above.

But of course, the present invention is not limited to these specific formulas, and variants are also possible. For example, instead of calculating the average of BxL and BxR in formula [4.7], one could also use Bx=BxL or Bx=BxR.

As another variation, the value of the coarse signal Sc may also be calculated as NN/DD, where NN stands for nominator, and DD stands for denominator, where NN is any of √(Bx1*Bx1+Bz1*Bz1) or √(Bx1*Bx2+Bz1*Bz2) or √(Bx2*Bx2+Bz2*Bz2) or √(Bxavg*Bxavg+Bzavg*Bzavg), and denominator=|dBxz|. The skilled person having the benefit of the present disclosure can easily think of other variants.

Figure 6B:
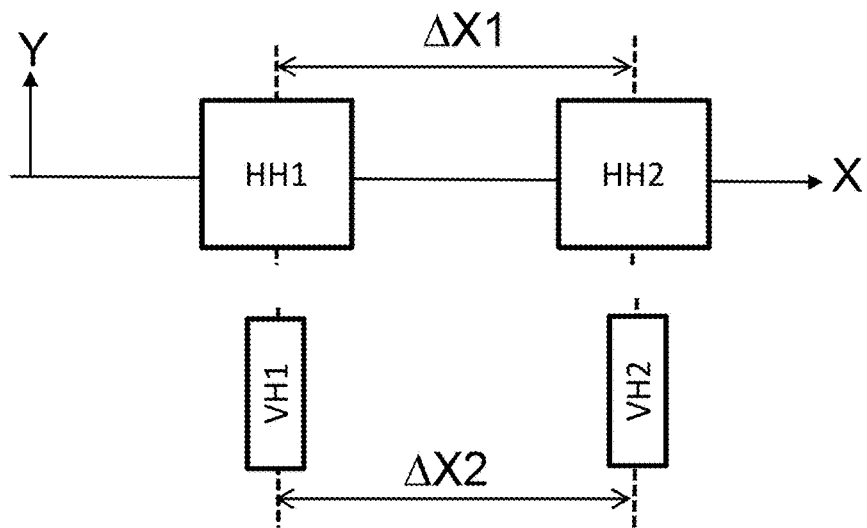
FIG. 6(b) is a schematic block-diagram showing another exemplary arrangement of sensor elements as can be used in a sensor device according to an embodiment of the present invention, which sensor device can be used in the linear position sensor system of FIGS. 1(a) to 1(c) and/or in the angular position sensor system of FIGS. 3(a) and 3(d). This sensor arrangement contains two horizontal Hall elements and two vertical Hall elements.

FIG. 6(b) is a schematic block-diagram showing another exemplary arrangement of sensor elements as can be incorporated in the linear position sensor device 102 of FIGS. 1(a) to 1(c) and/or in the angular position sensor device 202 of FIGS. 3(a) and 3(d). The sensor arrangement shown in FIG. 6(b) contains two horizontal Hall elements HH1, HH2 (without IMC) spaced apart over a distance ΔX1, and two vertical Hall elements VH1, VH2 spaced apart over a second distance ΔX2, which may be equal to ΔX1 or larger than ΔX1, or smaller than ΔX1. The two horizontal Hall elements HH1, HH2 can be used to measure the Bz field at two different positions, and the two vertical Hall elements VH1, VH2 can be used to measure the Bx field at two different locations.

More in particular, the following formulas may be used to determine an position X (if used in FIGS. 1(a) to 1(c)) or a (if used in FIGS. 3(a) and 3(d)):
The out-of plane magnetic field component at a first location can be determined as:

$$BzL=HH1 \qquad [5.1]$$

The out-of plane magnetic field component at a second location can be determined as:

$$BzR=HH2 \qquad [5.2]$$

From these two values, an out-of-plane magnetic field gradient dBz can be calculated as follows:

$$dBz=HH1-HH2 \qquad [5.3]$$

The in-plane magnetic field component at a first location can be determined as:

$$Bx1=VH1 \qquad [5.4]$$

The in-plane magnetic field component at a second location can be determined as:

$$Bx2=VH2 \qquad [5.5]$$

From these two values, an in-plane magnetic field gradient dBx can be calculated as follows:

$$dBx=VH1-VH2 \qquad [5.6]$$

From these values, an average in-plane magnetic field component |Bx| can be calculated as:

$$|Bx|=(BxL+BxR)/2 \qquad [5.7]$$

and an average out-of plane magnetic field component |Bz| can be calculated as:

$$|Bz|=(BzL+BzR)/2 \qquad [5.8]$$

Similar as for FIG. 6(a), based on these values, a coarse signal Sc and a fine signal Sf can be determined, for example based on the following formulas:

$$|Bxz|=\text{sqrt}(\text{sqr}(Bx)+\text{sqr}(Bz)) \qquad [5.9]$$

$$|dBxz|=\text{sqrt}(\text{sqr}(dBx/dx)+\text{sqr}(dBz/dx)) \qquad [5.10]$$

$$Sc=|Bxz|/|dBxz| \qquad [5.11]$$

$$Sf=\text{Arctan }2(dBx/dx,dBz/dx) \qquad [5.12]$$

The combination of Sc and Sf then yield a single value for X or α, as explained above. (It is noted that if ΔX1 is not equal to ΔX2, slightly different formulas may need to be used, but such details need not be explained in more detail here, and are well within the scope of the person skilled in the art of magnetic position sensors having the benefit of the present disclosure).

FIG. 7(a) is a schematic block-diagram showing another exemplary arrangement of sensor elements as can be incorporated in the linear position sensor device 152 of FIGS. 2(a) and 2(b) and/or in the angular position sensor device 252 of FIGS. 4(a) to 4(d).

The sensor arrangement shown in FIG. 7(a) an 7(b) contains two IMC structures, each with four horizontal Hall elements, and can be seen as a variant of the sensor arrangement of FIG. 6(a), in which: the horizontal Hall elements HP1 and HP2 can be used to determine Bu at position U, e.g. using the formula:

$$BuL=HP1-HP2 \qquad [6.1]$$

the horizontal Hall elements HP5 and HP6 can be used to determine By at position U, e.g. using the formula:

$$BvL=HP5-HP6 \qquad [6.2]$$

The horizontal Hall elements HP3 and HP4 can be used to determine Bu at position U+ΔU, e.g. using the formula:

$$BuR=HP3-HP4 \qquad [6.3]$$

The horizontal Hall elements HP7 and HP8 can be used to determine By at position U+ΔU, e.g. using the formula:

$$BvR=HP7-HP8 \qquad [6.4]$$

From these magnetic field values BuL, BvL, BuR, BvR, which are measured directly or indirectly, other values can be calculated, for example one or more of the following:
a first gradient along the U-direction (where the division by/ΔU is omitted, because it is constant):

$$dBu=BuR-BuL \qquad [6.5]$$

a second gradient along the U-direction (where the division by/ΔU is omitted, because it is constant):

$$dBv=BvR-BvL \qquad [6.6]$$

an average first magnetic field component value:

$$|Bu|=(BuL+BuR)/2 \qquad [6.7]$$

an average second magnetic field component value:

$$|Bv|=(BvL+BvR)/2 \quad [6.8]$$

an average magnitude of the magnetic field:

$$|Buv|=\mathrm{sqrt}(\mathrm{sqr}(Bu)+\mathrm{sqr}(Bv)) \quad [6.9]$$

$$|dBuv|=\mathrm{sqrt}(\mathrm{sqr}(dBu/du)+\mathrm{sqr}(dBv/du)) \quad [6.10]$$

a course signal:

$$Sc=|Buv|/|dBuv\| \quad [6.11]$$

a fine signal:

$$Sf=\mathrm{Arctan}\,2(dBu/du, dBv/du) \quad [6.12]$$

The combination of Sc and Sf then yield a single value for X or α, as explained above.

But of course, the present invention is not limited to these specific formulas, and variants are also possible. For example, instead of calculating the average of BuL and BuR in formula [6.7], one could also use Bu=BuL or Bu=BuR.

FIG. 7(b) shows a sensor arrangement comprises four vertical Hall elements, as can be incorporated in the linear position sensor device 152 of FIGS. 2(a) and 2(b) and/or in the angular position sensor device 252 of FIGS. 4(a) to 4(d). The sensor arrangement comprises:
a first vertical Hall configured for measuring BuL oriented in the U-direction at position U,
a second vertical Hall configured for measuring BvL oriented in the V-direction at position U,
a third vertical Hall configured for measuring BuR oriented in the U-direction at position U+ΔU,
a fourth vertical Hall configured for measuring BvR oriented in the V-direction at position U+ΔU.
The formulas [6.5] to [6.12] or similar formulas can then be used to obtain a coarse signal and a fine signal, from which a single position value X or α can be obtained, as explained above.

Figure 8:
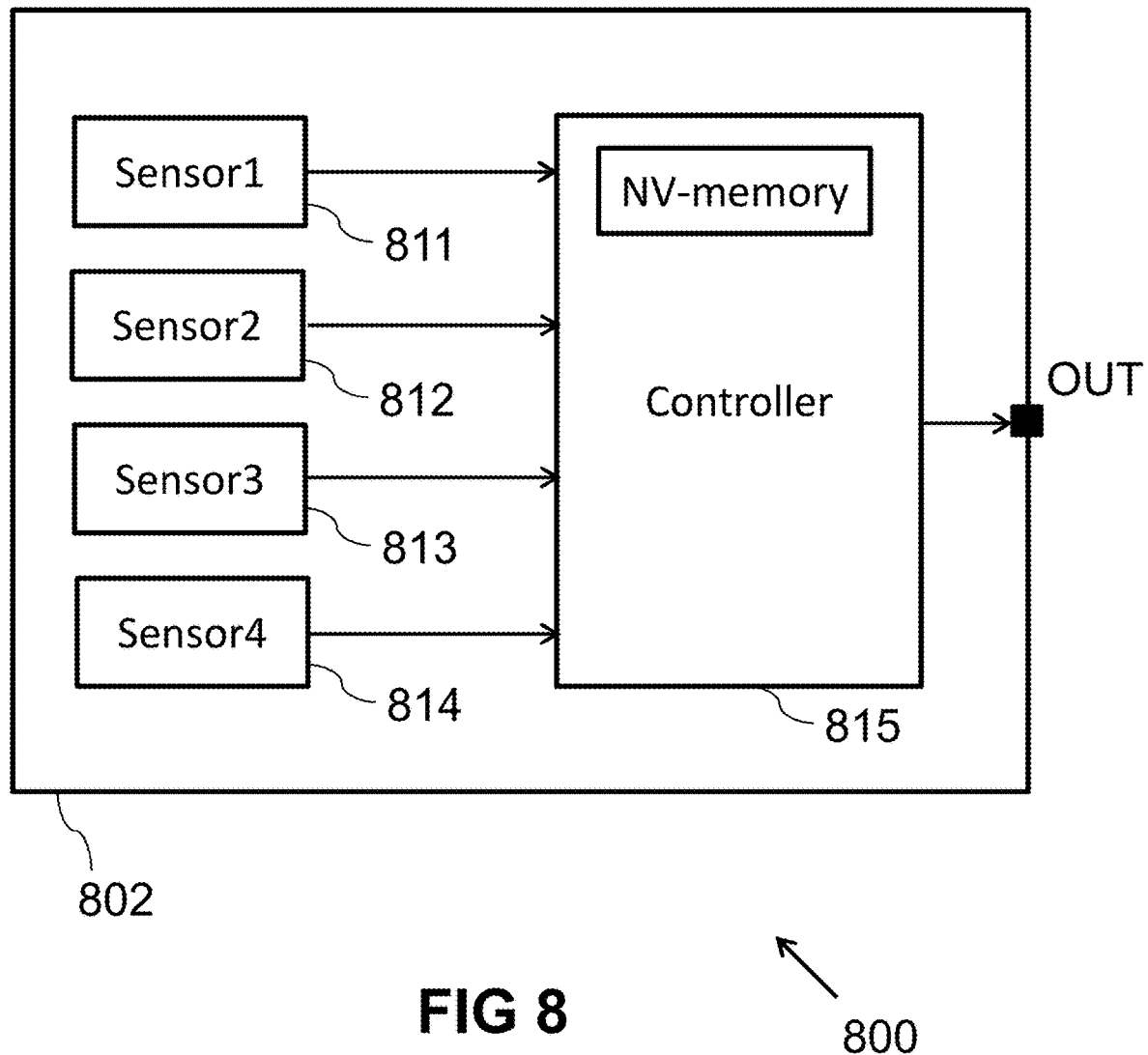
FIG. 8 shows a schematic block diagram of sensor devices according to embodiments of the present invention, as can be used in the position sensor system of FIG. 1(a) to FIG. 4(d).

FIG. 8 shows an exemplary schematic block diagram of a sensor device 800, as can be used in the linear position sensor system 100 of FIGS. 1(a) to 1(c), or the angular position sensor system 200 of FIGS. 3(a) and 3(d).

The position sensor device 800 shown in FIG. 8 comprises a plurality of four magnetic sensor elements 811, 812, 813, 814, for example four horizontal Hall elements (as shown in FIG. 6(a)) or two horizontal Hall elements and two vertical Hall elements (as shown in FIG. 6(b)), or four vertical Hall elements (as shown in FIG. 7(b)) for providing a first and a second magnetic field component (e.g. Bx and Bz, or Bu and Bv), but the invention is not limited thereto, and the sensor device may comprise more than four magnetic sensor elements, for example eight magnetic sensor elements (e.g. eight horizontal Hall elements, as shown in FIG. 7(a)).

The position sensor device 800 further comprises a processing unit 815 adapted for calculating a coarse signal "Sc" based on said at least first and second magnetic field component, for example using formula [4.11] or [5.11] or [6.11]. The processing unit 815 is further adapted for determining a first spatial gradient and a second spatial gradient (e.g. dBx/dx and dBz/dx or dBu/du and dBv/du), and for calculating a fine signal "Sf" based on these spatial gradients for example using formula [4.12] or [5.12] or [6.12].

The processing unit 815 is further adapted for determining said linear position X or said angular position α based on both the coarse signal Sc and on the fine signal Sf, for example using a look-up table and interpolation, or in any other suitable way.

The processing unit 815 may comprise a programmable device, adapted for performing a method of determining said linear or angular position, as described above, or as illustrated in FIG. 14.

Figure 9:
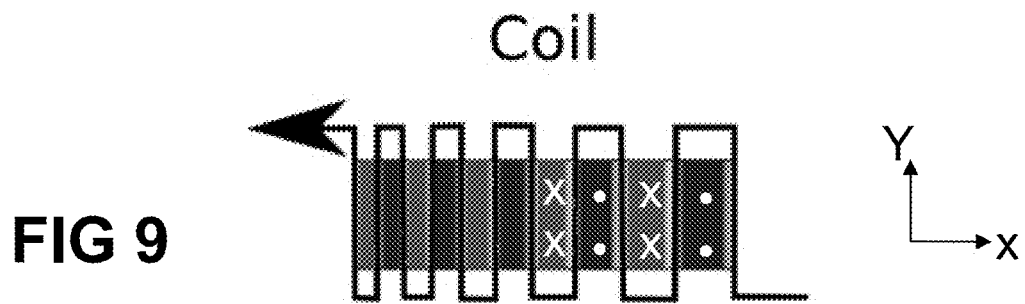
FIG. 9 illustrates a first method of producing a magnetic structure as may be used in the linear position sensor system of FIGS. 1(a) to 1(c) or FIGS. 2(a) and 2(b), based on magnetising a magnetic material using a (strong) current flowing through a conductor.

FIG. 9 illustrates a first method of producing a magnetic structure 901 as may be used in the linear position sensor system of FIGS. 1(a) to 1(c) or FIGS. 2(a) and 2(b). This method is based on magnetising a magnetic material using a relatively strong current (a technique known per se in the art, but not for this particular topology). What is shown is a top view of a surface of a structure comprising magnetic material. At a small distance above the surface, an electrical conductor is positioned as shown, forming a zig-zag, and a relatively large current is injected through the conductor, inducing a large magnetic field, which enters the page of the drawing (indicated by x), and which comes out of the page of the drawing (indicated by •), only a few vectors are shown.

Figure 10:
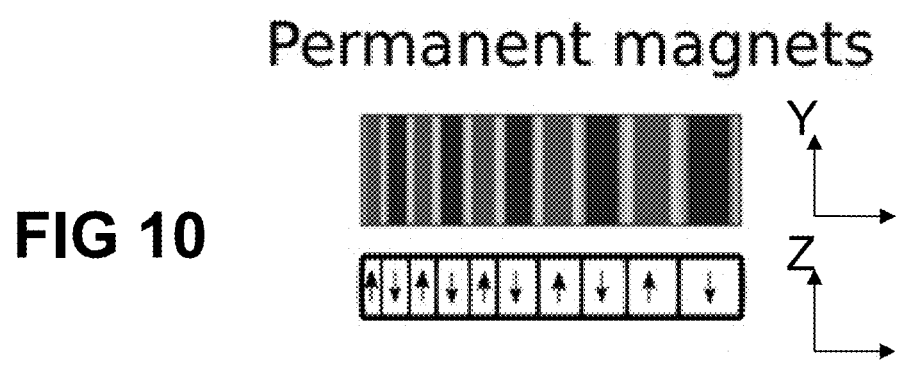
FIG. 10 illustrates a second method of producing a magnetic structure as may be used in the linear position sensor system of FIGS. 1(a) to 1(c) or FIGS. 2(a) and 2(b).

FIG. 10 illustrates a second method of producing a magnetic structure as may be used in the linear position sensor system of FIGS. 1(a) to 1(c) or FIGS. 2(a) and 2(b).

Such a magnet structure can be produced for example by a technique for making bonded magnets. This technique is known per se, albeit for equidistant magnet poles. Typically, a mixture known as "feed stock" containing magnetic particles is injected in a cavity of a mold, and one or more permanent magnets are located in close vicinity of, but outside the cavity during molding.

Figure 11:
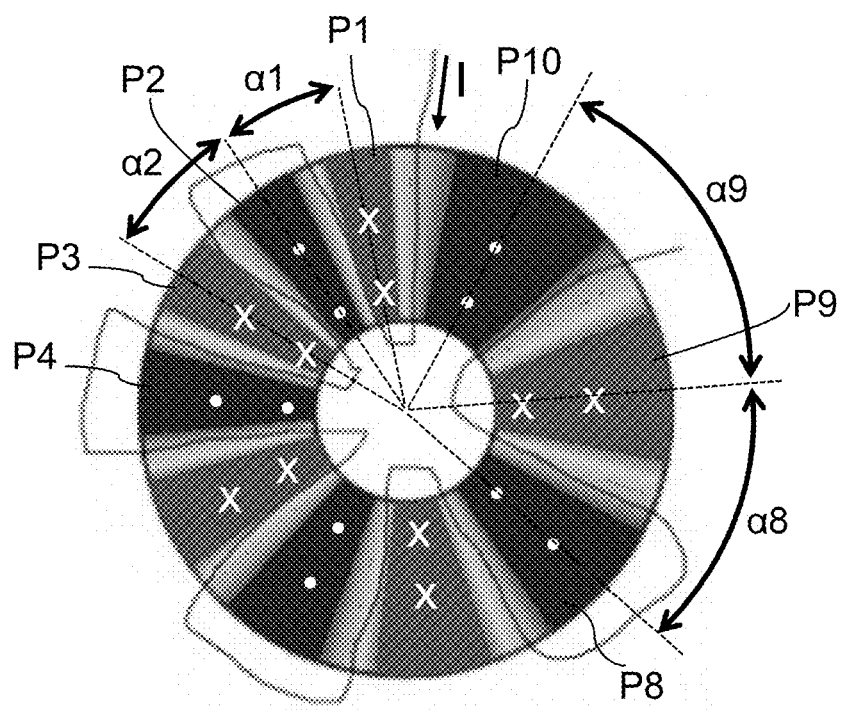
FIG. 11 illustrates a method of producing a magnetic structure as may be used in the angular position sensor system of FIGS. 3(a) and 3(d) or FIGS. 4(a) to 4(d), based on magnetising a magnetic material using a (strong) current flowing through a conductor.

FIG. 11 illustrates a method of producing a magnetic structure as may be used in the angular position sensor system of FIGS. 3(a) and 3(d) or FIGS. 4(a) to 4(d), based on magnetising a magnetic material. A similar technique as described in FIG. 9 is used here, mutatis mutandis. It is noted that in this drawing it is clearly shown that α1<α2<3< . . . <α9. In this particular example, the number of poles (which can be seen by a sensor device facing one of the ring shaped surfaces, as illustrated in FIGS. 3(a) and 3(d)) is 10, and the ratio of α9/α1=about 2.63, and the multiplication factor F=α3/α2=α2/α1=about 1.13, but as described above, the present invention is not limited thereto, and a different number of poles and/or a different ratio between the first and second angular distance, and/or a different multiplication factor F may be used.

Figure 12:
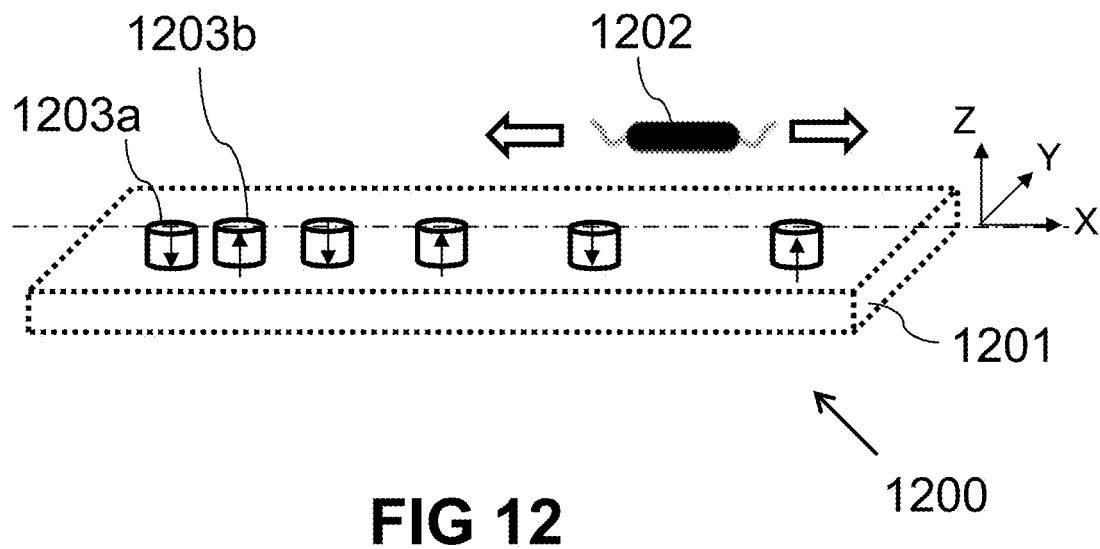
FIG. 12 illustrates yet another magnetic structure as may be used in the linear position sensor system of FIGS. 1(a) to 1(c). This magnetic structure contains a plurality of discrete magnets.

FIG. 12 illustrates yet another magnetic structure 1201 as may be used in the angular position sensor system of FIGS. 1(a) to 1(c). The magnetic structure comprises a non-magnetic structure functioning as a holder, with a plurality of openings, and in each opening a permanent magnet is inserted. The magnets can be axially magnetized, or the magnetization can also be in-plane or isotropic.

The same principles as explained above are also applicable here, mutatis mutandis. The magnets may be cylindrical magnets, but that is not absolutely required. The cylindrical magnets may have a single diameter (as shown) or may have different diameters (not shown). What is important is that the distance between the centers of the magnets varies.

The sensor device 1202 is oriented such that its semiconductor substrate is perpendicular to the direction of the remanent magnetic field inside the magnets, and such that its internal X-axis (along which the sensor elements are spaced apart, e.g. as illustrated for in FIG. 6(a) or FIG. 6(b), is parallel to the X-direction of the magnetic structure, along which the discrete magnets are located.

Figure 13:
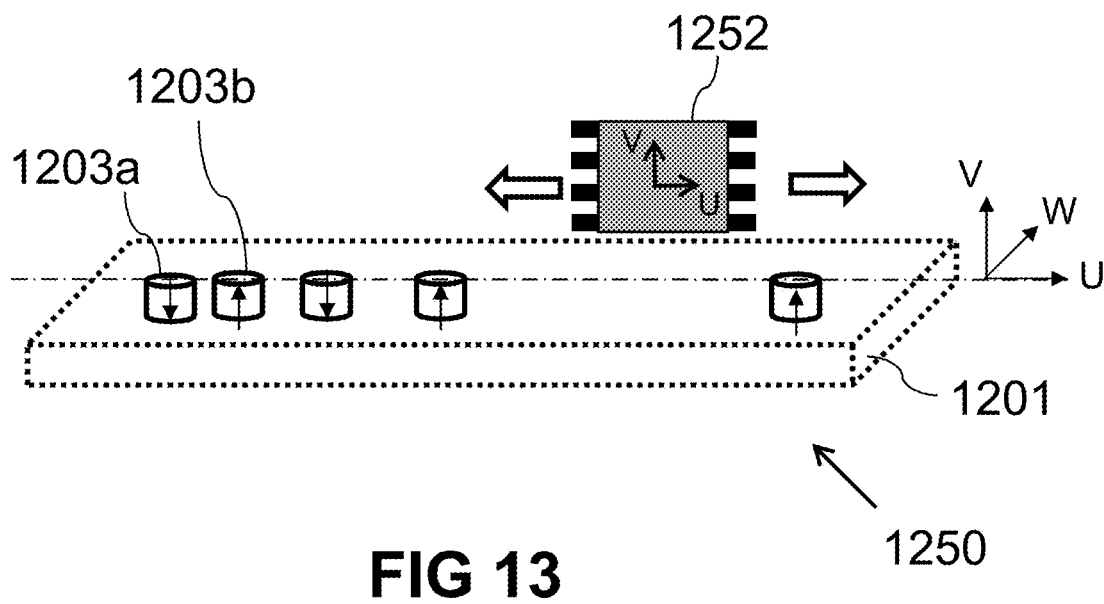
FIG. 13 shows a variant of FIG. 12.

FIG. 13 shows a variant of FIG. 12, where the sensor device 1252 is oriented such that its semiconductor substrate is parallel to the direction of the remanent magnetic field inside the magnets, and such that its internal U-axis (along which the sensor elements are spaced apart, e.g. as illustrated in FIG. 7(a) or FIG. 7(b), is parallel to the X-direction of the magnetic structure, along which the discrete magnets are located.

FIG. 14 illustrates a method 1400 of determining a position of a sensor device (see for example FIG. 8 with a sensor configuration of FIG. 6(a) or FIG. 6(b) or FIG. 7(a) or FIG. 7(b) relative to a magnetic structure (see for example the magnetic structure of FIGS. 1(a) to 1(c) or FIGS. 2(a) and 2(b) or FIGS. 3(a) and 3(d) or FIGS. 4(a) to 4(d) or FIG. 12 or FIG. 13) having a plurality of poles, and said sensor device comprising a plurality of magnetic sensors or sensor elements, and wherein the magnetic structure is movable (e.g. linearly or rotationally) relative to the sensor device or vice versa, and wherein a distance (Xpp, αpp) between centres of adjacent poles varies along a movement direction or along the movement trajectory.

The method comprises the steps of:
a) determining 1401 a first magnetic field component (e.g. Bx or Bu) oriented in a movement direction, and a second magnetic field component (e.g. Bz or Bv) oriented in a direction perpendicular to the movement direction, and calculating a coarse signal (Sc) based on these magnetic field components;
b) determining 1402 a first gradient (e.g. dBx/dx or dBu/du) of the first magnetic field component along the movement direction, and a second gradient (e.g. dBz/dx or dBv/du) of the second magnetic field component along said movement direction, and calculating a fine signal (Sf) based on these magnetic field gradients;
c) determining 1403 a position (e.g. X, α) based on both the coarse signal (Sc) and the fine signal (Sf).

The invention claimed is:

1. A position sensor system for determining a position of a sensor device relative to a magnetic structure, the system comprising:
said magnetic structure comprising a plurality of poles;
said sensor device comprising a plurality of magnetic sensors;
the magnetic structure being movable relative to the sensor device in a movement direction or along a movement trajectory, or vice versa;
wherein a distance between centres of adjacent poles of the magnetic structure varies along the movement direction or along the movement trajectory;
and the sensor device is adapted:
a) for determining one or more first magnetic field components oriented in a first direction substantially parallel to said movement direction or tangential to said movement trajectory, and one or more second magnetic field components oriented in a second direction substantially perpendicular to the first direction, and for calculating a coarse signal based on these magnetic field components; and
b) for determining a first gradient of the one or more first magnetic field component along the first direction, and a second gradient of the one or more second magnetic field component along the first direction, and for calculating a fine signal based on these gradients; and
c) for determining said position based on both the coarse signal and the fine signal.

2. A position sensor system according to claim 1, wherein the sensor device is movably arranged relative to the magnetic structure at a substantially constant distance from the magnetic structure.

3. A position sensor system according to claim 1, wherein the magnetic structure is an assembly of a plurality of discrete permanent magnets; or
wherein the magnetic structure comprises a monolithic magnetic material which is magnetized so as to have multiple poles oriented in opposite directions.

4. A position sensor system according to claim 1, wherein the magnetic structure has an elongated shape having a linear axis.

5. A position sensor system according to claim 4, wherein said distance between centres of adjacent poles varies strict monotonically along said linear axis.

6. A position sensor system according to claim 1, wherein the magnetic structure has a curved shape having a curved axis.

7. A position sensor system according to claim 6, wherein said distance between centres of adjacent poles varies strict monotonically along said curved axis.

8. A position sensor system according to claim 1, wherein a remanent magnetic field inside the magnetic material is oriented substantially perpendicular to the first direction or substantially parallel to said second direction.

9. A position sensor system according to claim 1, wherein the sensor device comprises a first integrated magnetic concentrator and a first and a second horizontal Hall element arranged on opposite sides of the first magnetic concentrator, and a second integrated magnetic concentrator located at a predefined distance from the first magnetic concentrator, and a third and a fourth horizontal Hall element arranged on opposite sides of the second magnetic concentrator, the first, second, third and fourth horizontal Hall element being collinear; or
wherein the sensor device comprises a first integrated magnetic concentrator and a first group of four horizontal Hall element arranged near an edge of the first magnetic concentrator, and a second integrated magnetic concentrator located at a predefined distance from the first magnetic concentrator, and a second group of four horizontal Hall elements arranged near an edge of the second magnetic concentrator.

10. A position sensor system according to claim 1, wherein the sensor device comprises two horizontal Hall elements spaced over a first distance in the first direction; and
comprises two vertical Hall elements spaced over a second distance in the first direction.

11. A position sensor system according to claim 1, wherein the sensor device is adapted for calculating the coarse signal in accordance with the following formula:

$$Sc=\sqrt{[sqr(Bx)+sqr(Bz)]}/\sqrt{[sqr(dBx/dx)+sqr(dBz/dx)]},$$

wherein Sc is the coarse signal, √ is the square root function, sqr is the square function, Bx is the first magnetic field component, and Bz is the second magnetic field component, dBx/dx is the gradient of the first magnetic field component along the first direction, dBz/dx is the gradient of the second magnetic field component along the first direction.

12. A position sensor system according to claim 1, wherein the sensor device is adapted for calculating the fine signal in accordance with the following formula:

$$Sf=\text{Arctan }2(dBx/dx, dBz/dx)$$

wherein Sf is the fine signal, Arctan 2 is the inverse arctangent function, dBx/dx is the gradient of the first magnetic field component along the first direction, dBz/dx is the gradient of the second magnetic field component along the first direction.

13. A position sensor system according to claim 1, wherein the sensor device is adapted for determining said position by determining a plurality of at least two candidate positions based on the fine signal, and then selecting one of these candidate positions based on the coarse signal.

14. A position sensor device for use in a position sensing system according to claim 1, the position sensor device comprising:
   a semiconductor substrate;
   a plurality of sensor elements for determining first magnetic field components oriented in a first direction substantially parallel to the substrate on at least two different locations spaced apart over a predefined distance along the first direction, and for determining second magnetic field components oriented in a second direction substantially perpendicular to the first direction, substantially parallel to the substrate or substantially perpendicular to the substrate, on at least two different locations spaced apart over said predefined distance along said first direction;
   a processing unit adapted for calculating a coarse signal based on at least some of these magnetic field components;
   the processing unit being further adapted for determining a first gradient of the first magnetic field component along the first direction, and a second gradient of the second magnetic field component along the first direction, and for calculating a fine signal based on these gradients;
   the processing unit being further adapted for determining said position based on both the coarse signal and on the fine signal.

15. A method of determining a position of a sensor device relative to a magnetic structure having a plurality of poles, said sensor device comprising a plurality of magnetic sensors, the magnetic structure being movable relative to the sensor device in a movement direction or along a movement trajectory, or vice versa;
   wherein:
   a distance between centres of adjacent poles of the magnetic structure varies along the movement direction or along the movement trajectory;
   and the method comprises the steps of:
   a) determining one or more first magnetic field components oriented in a first direction substantially parallel to said movement direction or substantially tangential to said movement trajectory, and one or more second magnetic field components oriented in a second direction substantially perpendicular to the first direction, and calculating a coarse signal based on these magnetic field components; and
   b) determining a first gradient of the one or more first magnetic field component along the first direction, and a second gradient of the one or more second magnetic field component along the first direction, and calculating a fine signal based on these gradients;
   c) determining said position based on both the coarse signal and the fine signal.

16. A method according to claim 15, wherein step a) comprises:
   calculating the coarse signal in accordance with one of the following formulas:

$Sc=\sqrt{[sqr(Bx)+sqr(Bz)]}/\sqrt{[sqr(dBx/dx)+sqr(dBz/dx)]}$, or $Sc=[sqr(Bx)+sqr(Bz)]/[sqr(dBx/dx)+sqr(dBz/dx)]$, wherein Sc is the coarse signal, √ is the square root function, sqr is the square function, Bx is the first magnetic field component, and Bz is the second magnetic field component, dBx/dx is the gradient of the first magnetic field component along the first direction, and dBz/dx is the gradient of the second magnetic field component along the first direction; and/or
   wherein step b) comprises: calculating the fine signal in accordance with the following formula:

$Sf=\text{Arctan }2(dBx/dx, dBz/dx)$ wherein Sf is the fine signal, Arctan 2 is the inverse arctangent function, dBx/dx is the gradient of the first magnetic field component along the first direction, dBz/dx is the gradient of the second magnetic field component along the first direction; and/or
   wherein step c) comprises: determining said position by determining a plurality of at least two candidate positions based on the fine signal, and then selecting one of these candidate positions based on the coarse signal.

* * * * *